US008643260B1

(12) United States Patent
Nemeth et al.

(10) Patent No.: US 8,643,260 B1
(45) Date of Patent: Feb. 4, 2014

(54) SYSTEMS AND METHODS FOR DISPLAY ASSEMBLIES HAVING PRINTED MASKING

(75) Inventors: Paul R. Nemeth, Springville, IA (US); Kyle P. Dotson, Cedar Rapids, IA (US); Ryan N. Klaassen, Marion, IA (US); Brad J. Covington, Fairfax, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 228 days.

(21) Appl. No.: 13/224,701

(22) Filed: Sep. 2, 2011

(51) Int. Cl.
| | |
|---|---|
| H01J 5/16 | (2006.01) |
| H01J 61/40 | (2006.01) |
| H01J 1/26 | (2006.01) |
| H01J 1/30 | (2006.01) |
| H01J 9/00 | (2006.01) |
| H01J 9/26 | (2006.01) |

(52) U.S. Cl.
USPC ............. 313/117; 313/110; 445/24; 445/25

(58) Field of Classification Search
USPC ............................. 313/110–117; 445/24–25
See application file for complete search history.

(56) References Cited

U.S. PATENT DOCUMENTS

| | | | |
|---|---|---|---|
| 3,616,197 | A | 10/1971 | Amberg et al. |
| 3,851,758 | A | 12/1974 | Makhijani et al. |
| 4,188,254 | A | 2/1980 | Hemperly, Jr. |
| 4,747,577 | A | 5/1988 | Dimock |
| 5,108,532 | A | 4/1992 | Thein et al. |
| 5,566,840 | A | 10/1996 | Waldner et al. |
| 5,592,288 | A | 1/1997 | Sampica et al. |
| 5,678,303 | A | 10/1997 | Wichmann |
| 5,918,517 | A | 7/1999 | Malapert et al. |
| 5,950,512 | A | 9/1999 | Fields |
| 6,128,066 | A | 10/2000 | Yokozeki |
| 6,388,724 | B1 | 5/2002 | Campbell et al. |
| 6,481,482 | B1 | 11/2002 | Shimotomai |
| 6,614,057 | B2 | 9/2003 | Silvernail et al. |
| 6,681,668 | B1 | 1/2004 | Smirle |
| 6,803,245 | B2 | 10/2004 | Auch et al. |
| 6,832,538 | B1 | 12/2004 | Hwang |
| 6,984,545 | B2 | 1/2006 | Grigg et al. |
| 6,998,648 | B2 | 2/2006 | Silvernail |
| 7,273,403 | B2 | 9/2007 | Yokota et al. |
| 7,381,110 | B1 | 6/2008 | Sampica et al. |
| 7,435,311 | B1 | 10/2008 | Marzen et al. |

(Continued)

FOREIGN PATENT DOCUMENTS

| | | |
|---|---|---|
| JP | 01-210328 | 8/1989 |
| JP | 05-200880 | 8/1993 |

(Continued)

OTHER PUBLICATIONS

U.S. Appl. No. 12/009,393, filed Jan. 18, 2008, Sampica et al.

(Continued)

*Primary Examiner* — Anne M Hines
*Assistant Examiner* — Jose M Diaz
(74) *Attorney, Agent, or Firm* — Donna P. Suchy; Daniel M. Barbieri

(57) ABSTRACT

A method of making a display assembly includes providing a display, providing a cover glass, ink jetting an ink covering onto a perimeter portion of the cover glass, and assembling the display to the cover glass to form the display assembly. The ink covering prevents light from leaking from the display through the perimeter portion of the cover glass.

20 Claims, 5 Drawing Sheets

(56) References Cited

U.S. PATENT DOCUMENTS

| | | |
|---|---|---|
| 7,452,258 B1 | 11/2008 | Marzen et al. |
| 7,566,254 B2 | 7/2009 | Sampica et al. |
| 7,814,676 B2 | 10/2010 | Sampica et al. |
| 2002/0186343 A1 | 12/2002 | Liao et al. |
| 2003/0089214 A1 | 5/2003 | Fukuta et al. |
| 2003/0180528 A1 | 9/2003 | Flosenzier et al. |
| 2005/0126679 A1 | 6/2005 | Kim |
| 2005/0249946 A1 | 11/2005 | Hsu et al. |
| 2006/0035060 A1 | 2/2006 | Koyama et al. |
| 2006/0245171 A1 | 11/2006 | Kim et al. |
| 2007/0297736 A1 | 12/2007 | Sherman et al. |
| 2009/0120572 A1 | 5/2009 | Sampica et al. |
| 2009/0120585 A1 | 5/2009 | Sampica et al. |
| 2009/0126872 A1 | 5/2009 | Sampica et al. |
| 2009/0183381 A1 | 7/2009 | Sampica et al. |
| 2009/0183615 A1 | 7/2009 | Sampica et al. |
| 2009/0186218 A1 | 7/2009 | Sampica et al. |
| 2010/0039398 A1* | 2/2010 | Lin et al. .................. 345/173 |
| 2011/0255023 A1* | 10/2011 | Doyle et al. .................. 349/58 |
| 2012/0162032 A1* | 6/2012 | Yang et al. .................. 343/720 |
| 2012/0223725 A1* | 9/2012 | Liu .................. 324/658 |
| 2013/0129580 A1* | 5/2013 | Flavin et al. .................. 422/501 |

FOREIGN PATENT DOCUMENTS

| | | |
|---|---|---|
| JP | 05-293895 | 11/1993 |
| JP | 06-051484 | 2/1994 |
| JP | 09-057779 | 3/1997 |
| JP | 10-156853 | 6/1998 |
| JP | 10-244589 | 9/1998 |
| JP | 2000-141388 | 5/2000 |
| JP | 2004-233590 | 8/2004 |
| JP | 2006-218658 | 8/2006 |
| JP | 2006-334912 | 12/2006 |
| JP | 2007-206559 | 8/2007 |
| JP | 2008-238607 | 1/2008 |
| WO | WO 2004/046230 | 6/2004 |

OTHER PUBLICATIONS

U.S. Appl. No. 12/009,482, filed Jan. 18, 2008, Sampica et al.
U.S. Appl. No. 12/009,372, filed Jan. 18, 2008, Sampica et al.
U.S. Appl. No. 12/009,472, filed Jan. 18, 2008, Sampica et al.
U.S. Appl. No. 12/789,169, filed May 24, 2010, Nemeth et al.
U.S. Appl. No. 12/095,787, filed Apr. 27, 2011, Marzen et al.
Kipp, D.O. (2004;2010). Plastic Material Data Sheets. MatWeb—Division of Automation Creation, Inc., Online version available at: http://www.knovel.com/web/portal/browse/display?_EXT_KNOVEL_DISPLAY_bookid=1023&VerticalID=0, date retrieved Aug. 10, 2011, 6 pps.
Walker, Geoff, GD-Itronix Dynavue Technology, The Ultimate Outdoor-Readable Touch-Screen Display, Rugged PC Review, pp. 1-4, United States of America.

* cited by examiner

SYSTEMS AND METHODS FOR DISPLAY ASSEMBLIES HAVING PRINTED MASKING

BACKGROUND

The present disclosure relates to the field of display assemblies. More specifically, the present disclosure relates to systems and methods for making display assemblies having printed maskings or masked areas.

There are many challenges associated with providing display assemblies (e.g., liquid crystal display (LCD) assemblies, etc.) and preventing the leakage of light from around the perimeters of the active areas of displays (e.g., LCDs, LEDs, etc.) for such display assemblies.

Various embodiments disclosed herein may provide improved systems and methods for providing a custom masked area that prevents the leakage of light from around the perimeter of display assemblies.

SUMMARY

One embodiment relates to a method of making a display assembly, the method comprising providing a display; providing a cover glass; ink jetting an ink covering onto a perimeter portion of the cover glass; and assembling the display to the cover glass to form the display assembly; wherein the ink covering prevents light from leaking from the display through the perimeter portion of the cover glass.

Another embodiment relates to a method of making a display assembly, the method comprising providing a display; providing a cover glass having a display area configured to permit viewing of a visual display provided by the display; ink jetting an ink covering onto a perimeter of a first surface of the cover glass; and assembling the display to the cover glass to form the display assembly, wherein the first surface of the cover glass is coupled to the display; wherein the ink covering prevents light from leaking from the display around the perimeter of the cover glass.

Another embodiment relates to a display assembly comprising a display; a cover glass comprising a glass substrate; a touchscreen disposed between the cover glass and the display; and an ink jetted ink mask provided about a perimeter area of at least one of the display, the cover glass, and the touch screen.

DETAILED DESCRIPTION OF EXEMPLARY EMBODIMENTS

The present disclosure is generally related to display assemblies, and more specifically, to systems and methods for providing printed maskings on one or more portions of a display assembly. Printed masks are often required with display assemblies to prevent light leakage from around the edges of the display, particularly in environments where readability in sunlight requires high contrast ratios. Displays include an "active area" the provides images intended to be viewed by users. Light leakage from around the perimeter of the active display area is undesirable, as it may create a "halo" or other effect. Conventional methods of masking are expensive both in terms of material and handling costs, and furthermore often require undesirable chemicals to clean used tooling and processing areas.

Various embodiments disclosed herein are directed to improved systems and methods for printing masks on to one or more components of display assemblies such as laminated display assembly (e.g., a liquid crystal display (LCD), etc.). According to various embodiments, decorative designs (e.g., digital images, etc.) may be provided on optically clear (e.g., transparent) substrates (e.g., rigid substrates, semi-rigid substrates, etc.) to provide a custom display/mask feature for display assemblies. The display assemblies disclosed herein may be usable in a wide variety of applications, including aircraft applications, ground vehicle applications, marine applications, and the like.

Figure 1:
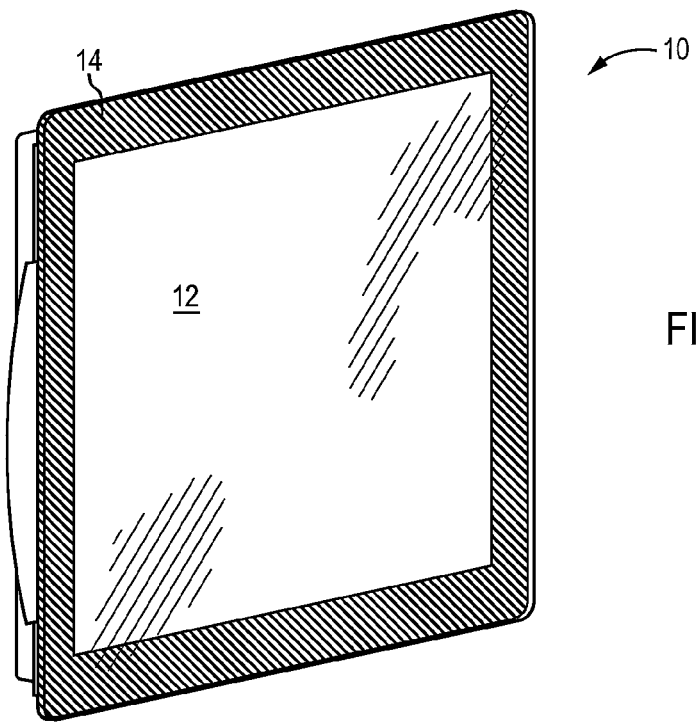
FIG. 1 is a perspective view of a display assembly according to an exemplary embodiment.

Referring to FIG. 1, a display assembly 10 is shown according to an exemplary embodiment. Display assembly 10 may be any of a wide variety of displays, including an LCD display assembly, an LED display assembly, etc., and may incorporate a touch screen (e.g., a resistive or capacitive touch screen, etc.) to permit users to provide inputs via display assembly 10. As shown in FIG. 1, display assembly 10 includes a display area 12 surrounded by a non-display, or masked area, 14. Display area 12 is intended to provide visual displays to users and in some embodiments, to receive inputs from users (e.g., when used in connection with a touch screen as part of the display assembly).

Figure 2:
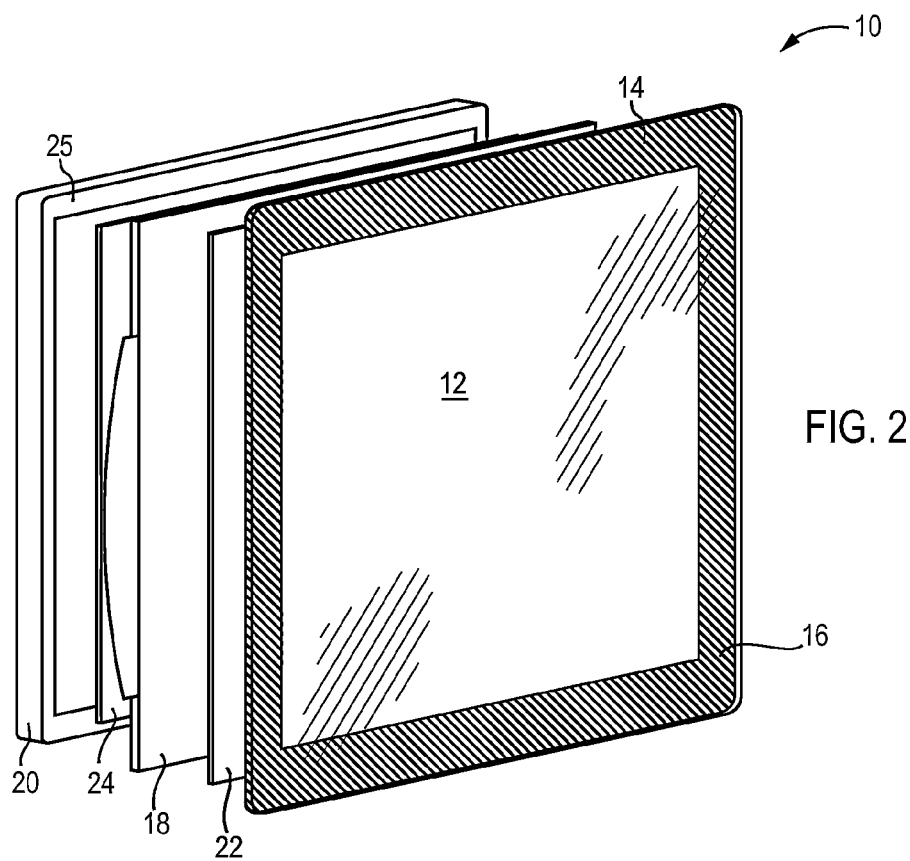
FIG. 2 is an exploded perspective view of the display assembly of FIG. 1 according to an exemplary embodiment.

Referring to FIG. 2, display assembly 10 is shown in greater detail according to an exemplary embodiment. As shown in FIG. 2, display assembly 10 includes a cover glass 16, a touch screen 18, and a display 20. In some embodiments, cover glass 16 may be a rigid or semi-rigid generally planar piece of glass or other transparent material intended to provided protection to other components of display assembly 10 and to permit a display image provided by display 20 to be viewed through cover glass 16. Alternatively, cover glass 16 may have a non-planar (e.g., non-flat, curved, irregular, etc.) profile. Cover glass 16 may be or include a variety of materials, including various polyester and acrylic films, soda-lime and/or silicate glass materials, and the like. Touch screen 18 may be any suitable touch screen assembly configured to enable users to provide inputs to, e.g., a computer system (not shown) via display assembly 10. Display 20 may be any suitable display, including liquid crystal displays (LCDs), light emitting diodes (LEDs), Organic LEDs (OLEDs), and the like, and may include a frame 23 extending about a portion or all of the display.

Referring further to FIG. 2, according to an exemplary embodiment, cover glass 16 may be bonded to touch screen 18 using a suitable adhesive. For example, in some embodiments, a pressure sensitive adhesive (PSA) layer 22 is positioned between cover glass 16 and touch screen 18 and used to bond cover glass 16 to touch screen 18 using, for example, a dry film lamination process. Any suitable pressure sensitive adhesive may be used according to various alternative embodiments. In some embodiments, the PSA is transparent to permit users to view display 20 through cover glass 16 and touch screen 18. According to alternative embodiments, a liquid adhesive may be used in place of the PSA to bond various components of display assembly 10 together.

In a similar manner, touchscreen 18 may be bonded to display 20 using a suitable adhesive. For example, in some embodiments, a pressure sensitive adhesive (PSA) layer 24 is positioned between touch screen 18 and display 20 and used to bond touch screen 18 to display 20 using, for example, a dry film lamination process. Any suitable pressure sensitive adhesive may be used according to various alternative embodiments. As indicated earlier, in some embodiments, the PSA is transparent to permit users to view display 20 through cover glass 16 and touch screen 18.

It should be noted that while in FIG. 2 display assembly 10 is shown to include touch screen 18 provided between cover glass 16 and display 20, according to various alternative embodiments, display assembly 10 may be provided without touch screen 18, such that cover glass 16 is bonded directly to display 20 without a touch screen therebetween. In such embodiments, cover glass 16 may be bonded to display 20 in a similar manner as discussed above.

Exemplary dry film lamination processes that may be utilized in combination with the various embodiments disclosed herein (e.g., to bond a cover glass to a touch screen, to bond a cover glass to a display, to bond a touch screen to a display, etc.) are illustrated in U.S. patent application Ser. No. 12/009,375, filed Jan. 18, 2008 (U.S. Patent Appl. Publ. No. 2009/0120572) which is incorporated herein by reference in its entirety.

According to various exemplary embodiments, cover glass 16 may be provided with one or more masked portions, as shown in FIGS. 1-2 as masked portion 14 (e.g., a mask, masked area, etc.). Masked portion 14 is intended to reduce and/or eliminate light leakage through cover glass 16. For example, display 20 (e.g., an LED display) generates light that passes though cover glass 16. It is often undesirable to have light "leak" around the edges of display assembly 10 (e.g., from around the perimeter of the active area of the display). As such, maskings may be used to form an opaque, or at least translucent, area about the perimeter of display assembly 10 (e.g., about the perimeter of the active area of an LCD or other display).

According to an exemplary embodiment, cover glass 16 includes a substrate 24 (e.g., a glass material, etc.) upon which mask 14 is applied. In some embodiments, masked area 14 extends about the perimeter of cover glass. Masked area 14 may have a generally constant width, or alternatively mask 14 may have a width that varies about the perimeter of cover glass 16. The specific width of masked area 14 may be varied to suit a particular application. In the case of cover glasses for displays, the mask be provided such that the mask is adjacent and/or aligned with the active area of the display. In further embodiments, the mask may be spaced apart from the edge of the active area of a display based on the thickness of a cover glass (e.g., so as not to interfere with angled viewing of displayed images, etc.).

According to an exemplary embodiment, mask 14 is applied utilizing an ink jet printer. Generally, an ink jet printer is a type of printer that creates images on a surface (e.g., a substrate, etc.) by propelling droplets of ink onto the surface. Ink jet printers may be utilized to reproduce digital images received from, e.g., a computer system, onto the substrate.

Figure 6:
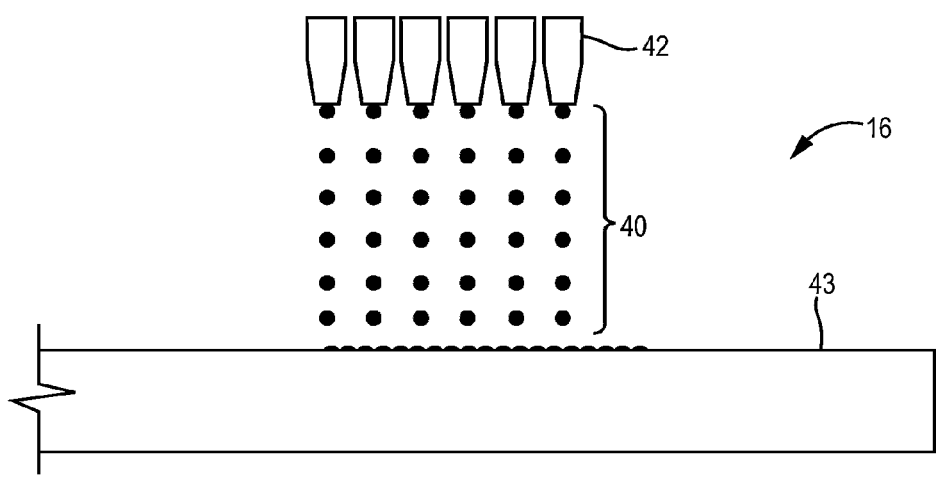
FIG. 6 is a schematic representation illustrating an ink jet process according to an exemplary embodiment.
Figure 4:
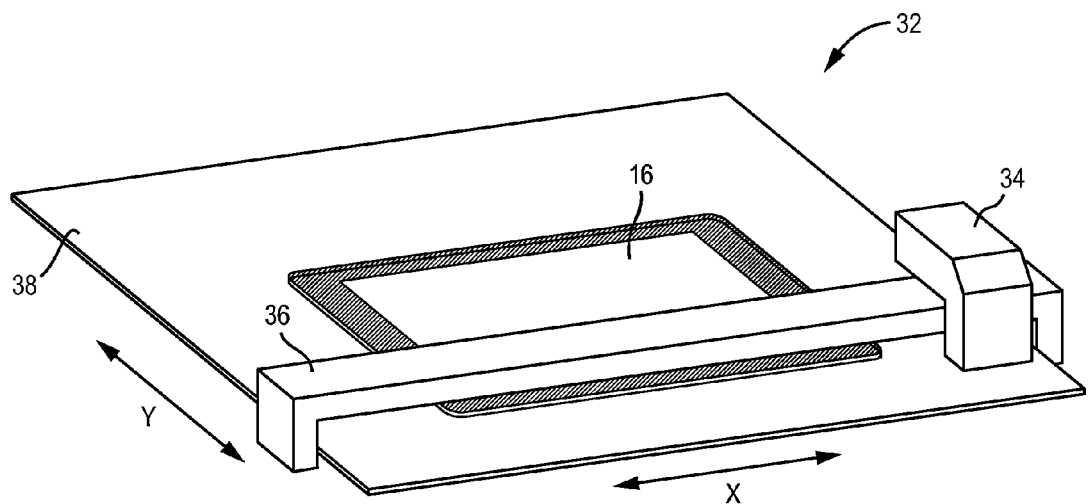
FIG. 4 is a perspective view of a portion of an ink jet printer and a display assembly according to an exemplary embodiment.
Figure 5:
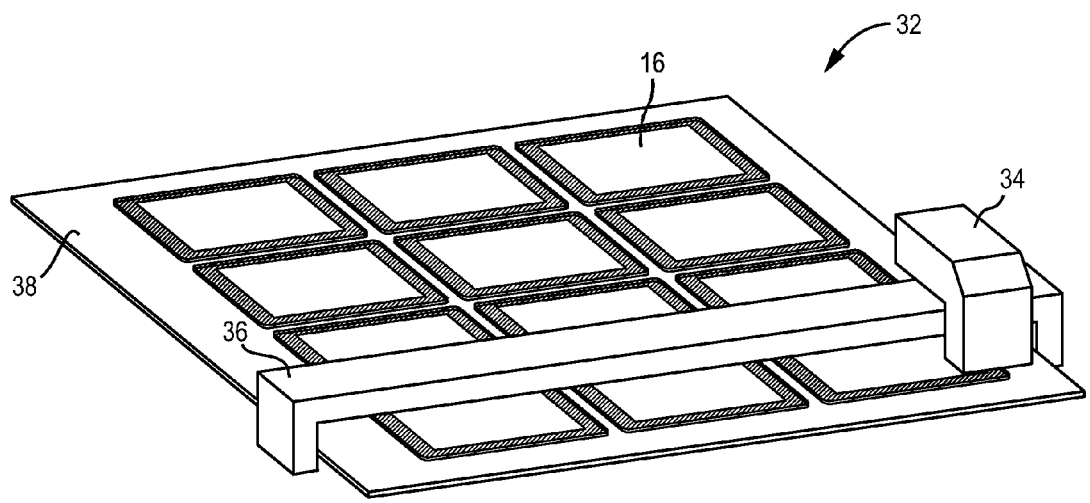
FIG. 5 is a perspective view of an ink jet printer and a number of display assemblies according to an exemplary embodiment.
Figure 7A:
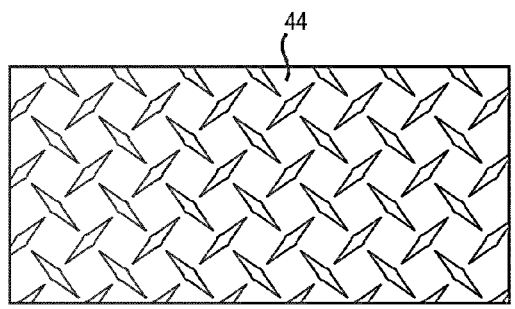
FIGS. 7A-7G are illustrations of various ink jet patterns that may be applied to display assemblies according to various exemplary embodiments.
Figure 7B:
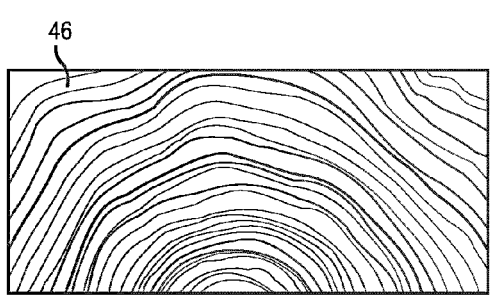
Figure 7C:
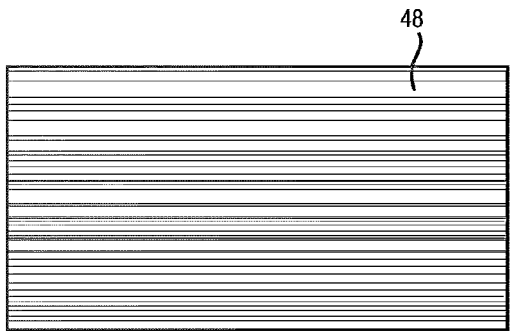
Figure 7D:
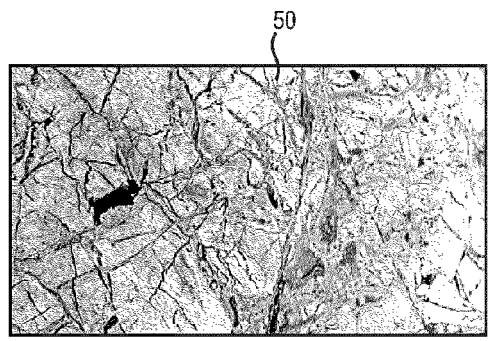
Figure 7E:
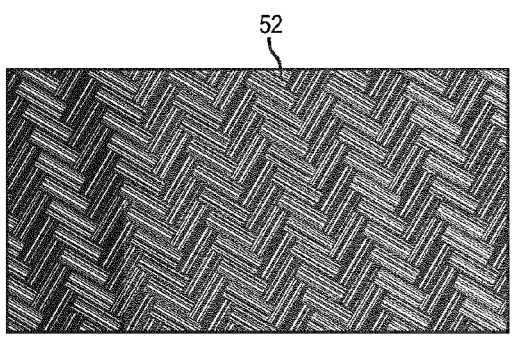
Figure 7F:
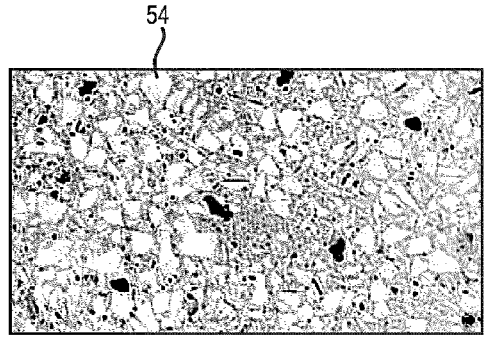
Figure 7G:
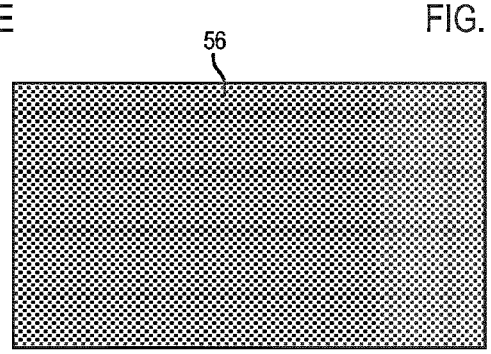

Referring now to FIGS. 4-6, according to an exemplary embodiment, an ink jet printer 32 may be used to ink jet one or more layers of ink onto cover glass 16. Printer 32 is configured to apply (e.g., ink jet) one or more layers of ink onto cover glass 16. Printer 32 includes a print head 34 that travels along a carriage 36 in the direction of arrow X shown in FIG. 4. Carriage 36 in turn may travel along one or more rails (not shown) or other suitable mechanism in the direction of arrow Y shown in FIG. 4. As such, print head 34 is capable of a full range of motion in the X-Y directions over the surface of cover glass 16. Cover glass 16 may rest on a table of printer 32 during the ink jet process. For example, in some embodiments, cover glass 16 may be supported by a vacuum table 38 that generates a negative pressure to secure cover glass 16 in place during printing. Other means of securing cover glass 16 may be used according to various alternative embodiments. Referring to FIG. 5, in some embodiments, a number of cover glasses 16 may be supported and printed simultaneously by printer 32.

Referring to FIG. 6, as print head 34 travels along carriage 36, a plurality of nozzles 42 dispense ink droplets 40 onto a surface 43 of cover glass 16. In some embodiments, surface 43 (the surface receiving the ink) forms the outer surface of display assembly 10. In other embodiments, surface 43 forms the inner surface of display assembly 10 (e.g., the surface that is in contact with PSA 22 shown in FIG. 2). Providing the ink mask on an inner surface of cover glass 16 may help protect the ink mask and increase the "robustness" of display assembly 10.

Figure 3:
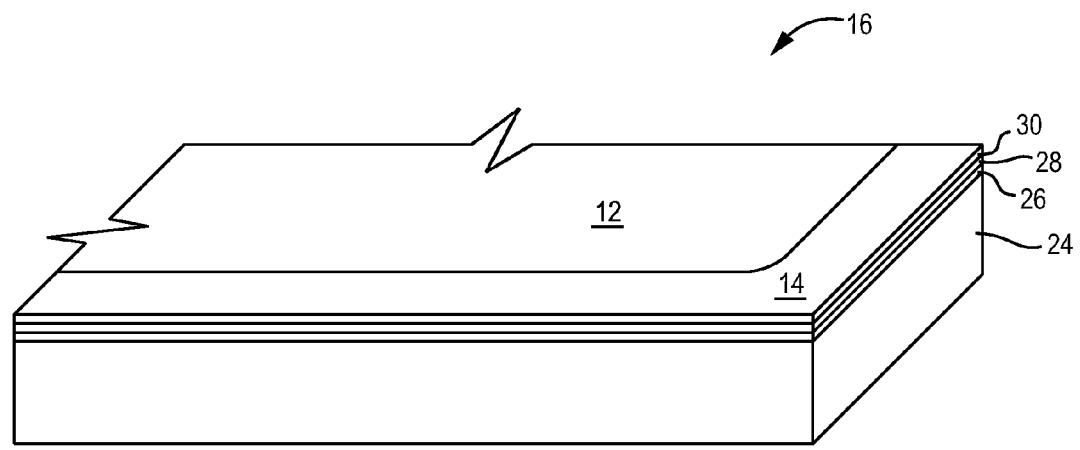
FIG. 3 is a partial perspective view of a display assembly having an ink jet mask applied thereon according to an exemplary embodiment.

Referring back to FIG. 3, mask 14 may include one or more separately applied layers of ink 26, 28, 30. For example, in embodiments where mask 14 is provided on the inside surface of cover glass 16, a first layer of ink applied (e.g., layer 26) will be visible through cover glass 16. As such, layer 26 may in some embodiments correspond with a desired color, pattern, etc. Additional layers 28, 30 (e.g., ink overcoats) may subsequently be applied to provide additional light leakage prevention (e.g., to enhance the opacity or light blocking properties of mask 14) and/or to provide protection for the other layers of ink.

According to various exemplary embodiments, ink jet printer 32 may apply mask 14 in a fashion such that mask 14 substantially matches a color, pattern, texture, etc. of surrounding components (e.g., a frame, surrounding components or panels, etc.). Referring to FIGS. 7A-7G, various mask patterns 44-56 are shown according to various exemplary embodiments that may simulate a variety of materials, including wood grain, brushed stainless steel, granite, marble, carbon fiber, diamond plate, etc. For example, in marine applications, where wood trim is often utilized in the vessel's system control area, mask 14 may be designed to have a wood grain appearance, thereby providing a customized and seamless integration of display assembly 10 into the controls area. Further solid colors (see FIG. 7G) may be used (e.g., black, white, gray, etc.). Other applications may include motor vehicles, aircraft applications, and the like.

Figure 8:
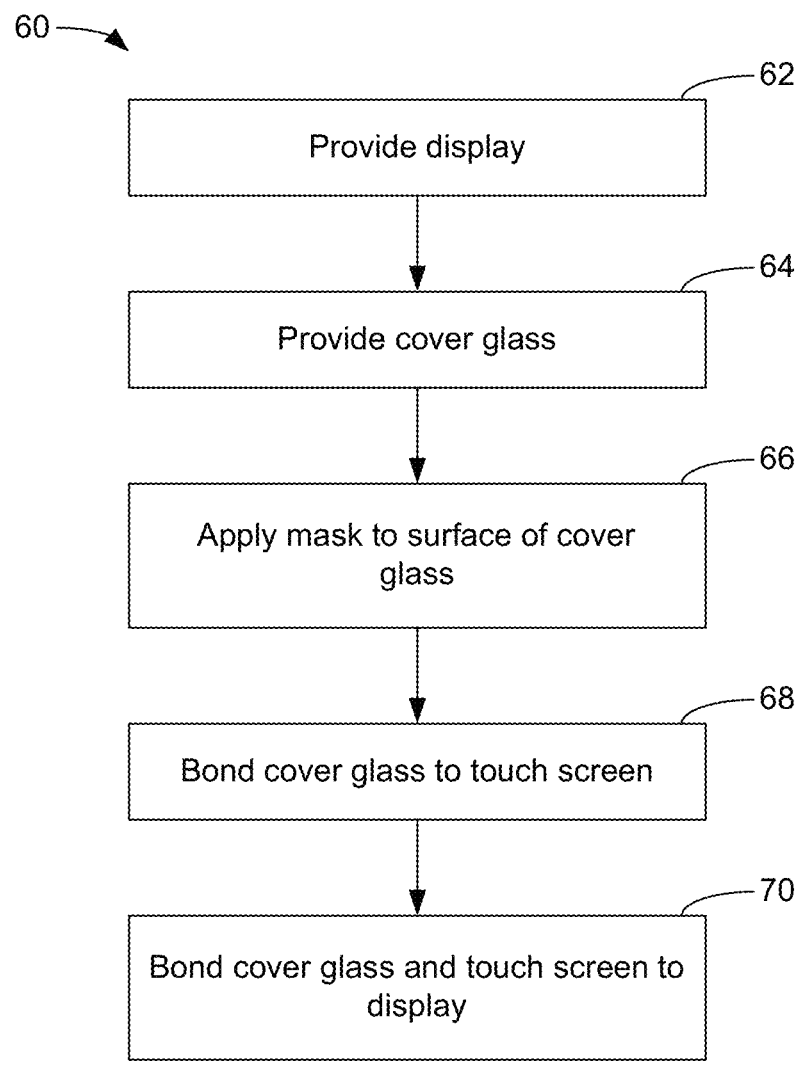
FIG. 8 is a flow chart illustrating a method for assembling a display assembly according to an exemplary embodiment.

Referring now to FIG. 8, a method 60 of making a display assembly such as display assembly 10 is shown according to an exemplary embodiment. First a display is provided (step 62). As indicated earlier, the display may be an LCD, LED, OLED, or any other suitable display. Next, a cover glass, or substrate, is provided (step 64). According to an exemplary embodiment, the cover glass is a generally planar sheet of glass material. Providing the cover glass may further include flattening and/or cleaning of one or more surfaces of the cover glass to ensure proper adhesion of the ink mask. Next, a mask is ink jetted onto a portion of a first surface of the cover glass (step 66). Ink jetting the mask may include providing multiple layers of ink (e.g., a primary coat and one or more over coats and/or protective coatings). Furthermore, the ink jetted mask may be applied such that the ink extends over one or more lateral edges of the cover glass/substrate so as to prevent light leakage from the edge of the substrate. According to some embodiments, the ink may then be cured (e.g., using heat, UV curing, etc.) to provide a more robust ink mask. According to other embodiments, the ink is cured during the ink jet printing process such that no separate curing step is required for many inks.

It should be noted that in some embodiments, rather than or in addition to ink jetting a mask onto a substrate/cover glass such as cover glass 16, a mask may be applied to other components of a display assembly. For example, in some embodiments, a mask may be applied directly to a surface of a touchscreen assembly (e.g., a resistive or capacitive touchscreen, etc.). In other embodiments, a mask may be applied directly to a surface of a display (e.g., an LCD or LED display, etc.). In yet further embodiments, other display components or substrates may be provided as part of the display assembly and may be provided with a mask as disclosed herein. Such substrates may include various filters and similar components (e.g., a night-vision filter, a notch filter, a microsheet of substrate material, and the like). For example, an ink jetted mask may be provided on the surface of a touchscreen that bonds to a display, on the surface of a protective microsheet material that bonds to a touchscreen, and the like.

After applying the mask to the cover glass, the cover glass is bonded to a touch screen (step 68). A suitable PSA may be utilized to bond the cover glass to the touch screen. In one embodiment, the first surface (with the ink mask) is bonded to the touch screen via a PSA. At step 70, the cover glass and touch screen are bonded to a display (e.g., an LED, LCD, OLED, etc.) to form a display assembly. In some embodiments, the touch screen may not be utilized such that the cover glass may be bonded directly to the display via the PSA. In yet further embodiments, the cover glass may be omitted and such that the mask is provide on a different component of the display assembly (e.g., a touchscreen, a display, a microsheet, a filter, etc., or combinations thereof).

As discussed above, providing display masks reduces and/or eliminates light leakage around the perimeter of display assemblies, thereby increasing the "readability" of the display, particularly in sunlight or other environments where high contrast ratios for displays are desirable. Conventional paints and silk screenings are expensive, and often require expertise in handling materials and meeting required tolerance levels. Furthermore, long set up times and UV, IR, or thermal curing is typically required.

Providing an ink jetted mask such as the masks described herein in connection with the various alternative embodiments may provide various advantages over other types of masking. Ink jet technology enables users to produce a wide variety of textured appearances for maskings to match various backgrounds, whereas more traditional paint or silk-screening are generally solid, opaque colors (e.g., black). Ink jetting provides high resolution images that may be based on digital images. Multi-layering black and colored inks provides a suitable ink structure that meets the requirements for light leakage and display lamination. Further, ink jets have minimal material waste/clean-up (e.g., providing a "green" process), and do not require any post-coating (e.g., curing) steps, thereby reducing material and labor costs in addition to reducing production cycle times.

For purposes of this disclosure, the term "coupled" shall mean the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. Such joining may also relate to mechanical, fluid, or electrical relationship between the two components.

It is important to note that the construction and arrangement of the elements of the display assembly as shown in the exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, materials, colors, orientations, etc.) without materially departing from the novel teachings and advantages of the subject matter recited in the embodiments. Accordingly, all such modifications are intended to be included within the scope of the present disclosure as defined in the appended claims. The order or sequence of any process or method steps may be varied or re-sequenced according to alternative embodiments. Other substitutions, modifications, changes, and/or omissions may be made in the design, operating conditions, and arrangement of the exemplary embodiments without departing from the spirit of the present disclosure.

What is claimed is:

1. A method of making a display assembly, the method comprising:
    providing a display;
    providing a cover glass;
    ink jetting an ink covering onto a perimeter portion of the cover glass; and
    assembling the display to the cover glass to form the display assembly;
    wherein the ink covering prevents light from leaking from the display through the perimeter portion of the cover glass, wherein ink jetting an ink covering comprises ink jetting a first color onto the perimeter portion of the cover glass and ink jetting a second color at least partially over the first color.

2. The method of claim 1, further comprising providing an adhesive layer over the ink covering, the adhesive layer configured to bond the cover glass to the display.

3. The method of claim 1, wherein ink jetting an ink comprises providing a pattern simulating a material.

4. The method of claim 1, wherein the ink is ink jetted onto a first surface of the cover glass, wherein the first surface of the cover glass is bonded to the display assembly.

5. The method of claim 1, wherein a frame is coupled to a perimeter of the cover glass, and wherein the ink covering is configured to provide a matching pattern to a pattern provided on the frame.

6. The method of claim 1, further comprising applying heat to the ink covering on the cover glass to cure the ink covering.

7. The method of claim 1, wherein the display is an LCD display.

8. The method of claim 7, wherein assembling the display to the cover glass comprises bonding the cover glass to a touch screen assembly and bonding the touch screen assembly to the display.

9. A method of making a display assembly, the method comprising:
- providing a display;
- providing a cover glass having a display area configured to permit viewing of a visual display provided by the display;
- ink jetting an ink covering onto a perimeter of a first surface of the cover glass; and
- assembling the display to the cover glass to form the display assembly, wherein the first surface of the cover glass is coupled to the display;
- wherein the ink covering prevents light from leaking from the display around the perimeter of the cover glass, wherein ink jetting an ink covering comprises ink jetting a first color and a second color covering at least a portion of the first color.

10. The method of claim 9, wherein the display is an LCD display.

11. The method of claim 9, wherein assembling the display to the cover glass comprises bonding the first surface of the cover glass to a touch screen and bonding the touch screen to the display.

12. The method of claim 11, wherein the touchscreen is bonded to the first surface of the cover glass and the display using at least one pressure sensitive adhesive.

13. The method of claim 9, wherein the ink jetting provides high resolution images.

14. The method of claim 9, wherein a frame is coupled to the perimeter of the cover glass, and wherein the ink covering is configured to provide a matching pattern to a pattern provided on the frame.

15. The method of claim 9, further comprising applying heat to the display assembly to cure the ink covering.

16. A display assembly comprising:
- a display;
- a cover glass comprising a glass substrate;
- a touchscreen disposed between the cover glass and the display;
- an ink jetted ink mask provided about a perimeter area of at least one of the display, the cover glass, and the touch screen, wherein the ink jetted ink mask comprises a plurality of layers of different-colored inks.

17. The display assembly of claim 16, further comprising a pressure sensitive adhesive disposed between the display and cover glass.

18. The display assembly of claim 16, wherein the ink jetted ink mask extends over lateral sides of the display, cover glass, or tough screen.

19. The display assembly of claim 16, wherein the mask is configured to prevent light from passing through the perimeter area.

20. The display assembly of claim 16, wherein the display is one of an LCD and an LED display.

* * * * *